US011742602B2

(12) United States Patent
Dangler et al.

(10) Patent No.: US 11,742,602 B2
(45) Date of Patent: Aug. 29, 2023

(54) PRESS-FIT REWORK METHOD

(71) Applicant: INTERNATIONAL BUSINESS MACHINES CORPORATION, Armonk, NY (US)

(72) Inventors: John R. Dangler, Rochester, MN (US); David J. Braun, St. Charles, MN (US); Theron Lee Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/744,993

(22) Filed: May 16, 2022

(65) Prior Publication Data

US 2022/0278470 A1 Sep. 1, 2022

Related U.S. Application Data

(62) Division of application No. 16/804,063, filed on Feb. 28, 2020, now Pat. No. 11,424,562.

(51) Int. Cl.
*H01R 43/042* (2006.01)
*H01R 12/58* (2011.01)
*H01R 12/70* (2011.01)
*H01R 43/20* (2006.01)
*H05K 3/30* (2006.01)

(52) U.S. Cl.
CPC ....... *H01R 12/585* (2013.01); *H01R 12/7064* (2013.01); *H01R 43/205* (2013.01); *H05K 3/306* (2013.01)

(58) Field of Classification Search
CPC ............... H05K 3/225; H05K 3/306; H05K 2203/1105; H05K 2201/10295; H05K 2201/1059; H01R 12/585; H01R 43/205; H01R 12/7064
See application file for complete search history.

(56) References Cited

U.S. PATENT DOCUMENTS

| 5,208,968 | A | * | 5/1993 | Camsell | ............... H01R 43/205 29/739 |
| 6,094,264 | A | * | 7/2000 | Wuyts | ................ H05K 13/0812 356/237.1 |
| 9,153,886 | B2 | * | 10/2015 | Nastasa | ................ H01R 12/585 |
| 9,532,486 | B1 | | 12/2016 | Hinkle et al. | |
| 9,564,697 | B2 | | 2/2017 | Eakins et al. | |

(Continued)

FOREIGN PATENT DOCUMENTS

JP 2009044155 A * 2/2009 ............. H01R 43/22

OTHER PUBLICATIONS

Becerra, et al. "Press Fit Technology Roadmap and Control Parameters for a High Performance Process". IPC APEX EXPO Conference Proceedings. 2017. 39p.

(Continued)

*Primary Examiner* — Paul D Kim
(74) *Attorney, Agent, or Firm* — Cantor Colburn LLP; Tihon Poltavets (57) ABSTRACT

A press-fit insertion method is provided. The press-fit insertion method includes loading press-fit pins into a connector, heating a printed circuit board (PCB) defining plated through holes (PTHs) into which the press-fit pins are insertable and pressing the connector onto the PCB to insert the press-fit pins into the PTHs with the PCB remaining heated.

4 Claims, 5 Drawing Sheets

(56) References Cited

U.S. PATENT DOCUMENTS

| | | |
|---|---|---|
| 9,806,443 B1 | 10/2017 | Thackston |
| 9,894,820 B1* | 2/2018 | Bautista, Sr. ...... H05K 13/0486 |
| 10,188,005 B2 | 1/2019 | Albert et al. |
| 2003/0232522 A1 | 12/2003 | Buondelmonte et al. |
| 2006/0264076 A1* | 11/2006 | Chen .................... H01R 12/585 |
| | | 439/82 |
| 2016/0050756 A1 | 2/2016 | Mundt et al. |
| 2021/0273355 A1 | 9/2021 | Dangler et al. |

OTHER PUBLICATIONS

List of IBM Patents or Patent Applications Treated as Related; Date Filed: May 16, 2022; 2 pages.

R. Lamparter. "Thread: Press fits & using heat". (2010). Practical Machinist.com. Retrieved on Sep. 27, 2019. 7p.

Vincotech. "Press-Fit Technology" vincotech.com. 2020. 4p.

* cited by examiner

PRESS-FIT REWORK METHOD

This is a division of application Ser. No. 16/804063 filed Feb. 28, 2020, now U.S. Pat. No. 11,424,562.

BACKGROUND

The present invention generally relates to press-fit connections and, more specifically, to improving press-fit connection insertions using heat.

In press-fit technology, press-fit pins of connectors are inserted into plated through-holes (PTHs) of printed circuit boards (PCBs) and thus form electrical connections with the PTHs without the need for soldering. Typically, the diameter of a press-fit zone of each press-fit pin is greater than the diameter of the corresponding PTH. Therefore, during the press-fit process, there is deformation (mainly) of the pin which allows the pin to slide into the PTH and make a tight electrical connection with the PTH.

SUMMARY

Embodiments of the present invention are directed to a press-fit insertion method. A non-limiting example of the press-fit insertion method includes loading press-fit pins into a connector, heating a printed circuit board (PCB) defining plated through holes (PTHs) into which the press-fit pins are insertable and pressing the connector onto the PCB to insert the press-fit pins into the PTHs with the PCB remaining heated.

Embodiments of the present invention are directed to a press-fit rework method. A non-limiting example of the press-fit rework method includes loading press-fit pins, which are inserted into plated through holes (PTHs) of a printed circuit board (PCB), into a connector, heating the PCB and removing the connector from the PCB to withdraw the press-fit pins from the PTHs with the PCB remaining heated.

Embodiments of the present invention are directed to a method of localized press-fit insertion and rework for use with a printed circuit board (PCB) defining sets of plated through holes (PTHs) into or from which corresponding sets of press-fit pins are insertable or withdrawable. A non-limiting example of the method includes identifying a connection problem with a set of the PTHs and a corresponding set of the press-fit pins, locally heating a portion of the PCB at a location of the set of the PTHs and manipulating the press-fit pins of the corresponding set of the press-fit pins relative to the PTHs with the portion of the PCB remaining locally heated.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

One or more embodiments of the present invention enable the use of out-of-specification plated through holes (PTHs) and press-fit pins using heat.

Recently, increasing numbers of press-fit connectors and PTHs are being used in certain industries. At the same time, the pins of press-fit connectors (hereinafter referred to as "press-fit pins") themselves are becoming smaller and smaller. The usability of these press-fit connectors and press-fit pins are often dependent on the capabilities of PCB vendors to accurately build PCB's with PTHs that meet certain drill-hole diameters, via copper plating thicknesses and finished-hole diameters. Occasionally, PCB vendors provide PCBs with PTHs that are smaller than the specifications call for, have excessively thin plating and/or a laminate structure without adequate support. In still other situations, press-fit pins can be too large or connectors might not have the proper structural support for the press-fit pins.

It is often the case that, where PTHs are not made to specification or the press-fit pins are too large or unsupported, fabrication schedules do not allow sufficient time for new PCBs or press-fit pins to be built. In these situations, if a contract manufacturer proceeds with connector insertion, press-fit pin buckling, press-fit pin cracks and/or PTH damage in the card can occur. To avoid this, contract manufacturers have tried to use lubricants and/or adjustments to insertion profiles. These sometimes work but can introduce yield, contamination and/or reliability problems.

Figure 1:
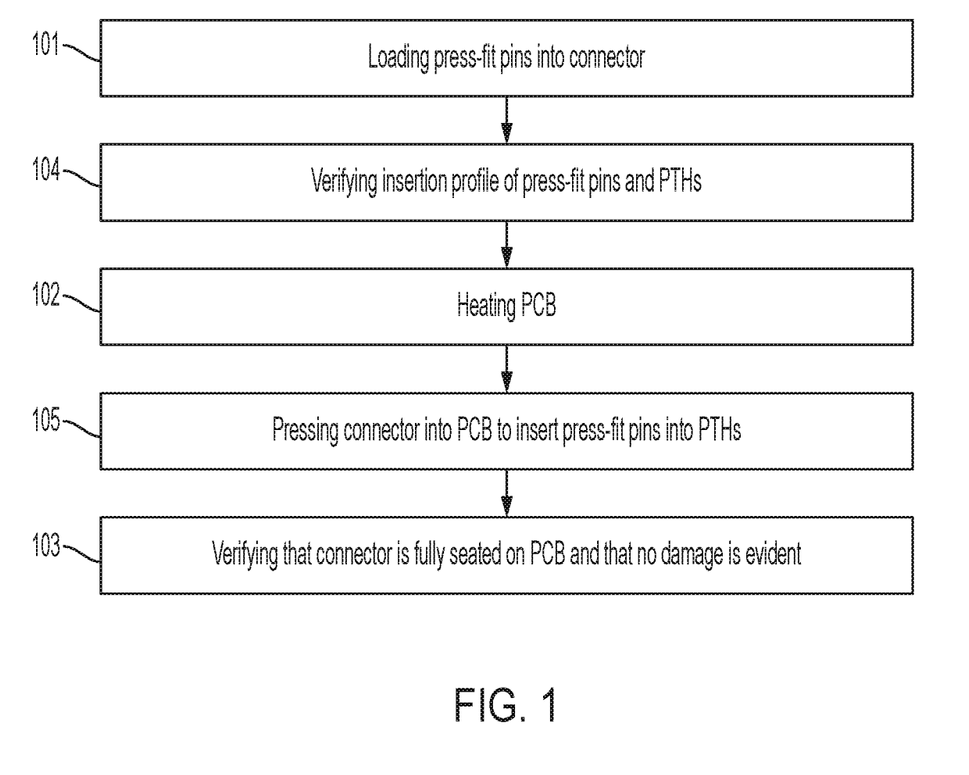
FIG. 1 is a flow diagram illustrating a press-fit insertion method according to one or more embodiments of the present invention.

Turning now to FIG. 1, a press-fit insertion method according to one or more embodiments of the present invention includes loading press-fit pins into a connector (101), heating a printed circuit board (PCB) defining plated through holes (PTHs) into which the press-fit pins are insertable (102) and pressing the connector onto the PCB to insert the press-fit pins into the PTHs with the PCB remaining heated (103).

It is normally expected that an initial diameter of each press-fit pin will be greater than a diameter of the corresponding PTH and that the pressing will cause each press-fit pin to deform from the initial diameter during an insertion thereof. However, in those cases where the initial diameter of each press-fit pin is greater than the diameter of the corresponding PTH by an amount which is outside of normal parameters, the pressing could result in press-fit pin damage or PTH damage but for the heating of operation 102. The heating of operation 102 effectively causes the PTH for each press-fit pin to enlarge due to thermal expansion which allows the corresponding press-fit pin to be inserted therein at reduced press-fit forces and without risk of stress or strain that might otherwise lead to the damage. The thermal expansion provided by the heating also negates any need for lubrication of the PTHs which could otherwise lead to yield, contamination or reliability problems.

The heating of the PCB of operation 102 can include heating the PCB to above an elevated temperature at which the insertion of the press-fit pins into the PTHs is eased due to thermal expansion and the pressing of operation 103 can be executed with the PCB remaining heated above the elevated temperature. In any case, as shown in Table 1 below, a force of the pressing with the PCB remaining heated above the elevated temperature is lower than a required pressing force with a temperature of the PCB being below the elevated temperature.

TABLE 1

|  | Insertion Room Temperature | Insertion at 100 Deg C. |
| --- | --- | --- |
| Average Full Connector Insertion Force (lb/pin) | 7.532 | 6.741 |
| Maximum Full Connector Insertion Force (lb/pin) | 8.109 | 6.987 |
| Minimum Full Connector Insertion Force (lb/pin) | 6.933 | 6.400 |
| Average Full Connector Extraction Force (lb/pin) | 8.300 | 12.000 |
| Maximum Full Connector Extraction Force (lb/pin) | 10.100 | 12.200 |
| Minimum Full Connector Extraction Force (lb/pin) | 8.100 | 11.800 |

While the heating of operation 102 is generally directed toward the PCB, it is to be understood that some heating effects can be exhibited at the press-fit pins or the connector. In these or other cases, it is to be understood that the degree of the heating and the heating effects of the PCB will be greater than the degree of the heating and the heating effects of the press-fit pins or the connector. That is, to whatever extent the press-fit pins or the connector experiences thermal expansion due to heating effects, thermal expansion of the PCB will be more significant. Thus, even thermally expanded press-fit pins will still be insertable into thermally expanded PTHs.

In accordance with one or more further embodiments of the present invention and as shown in FIG. 1, the method can further include at least one of verifying an insertion profile of the press-fit pins and the PTHs prior to the pressing (104) and verifying that the connector is fully seated on the PCB and that no damage is evident following the pressing (105).

Figure 2:
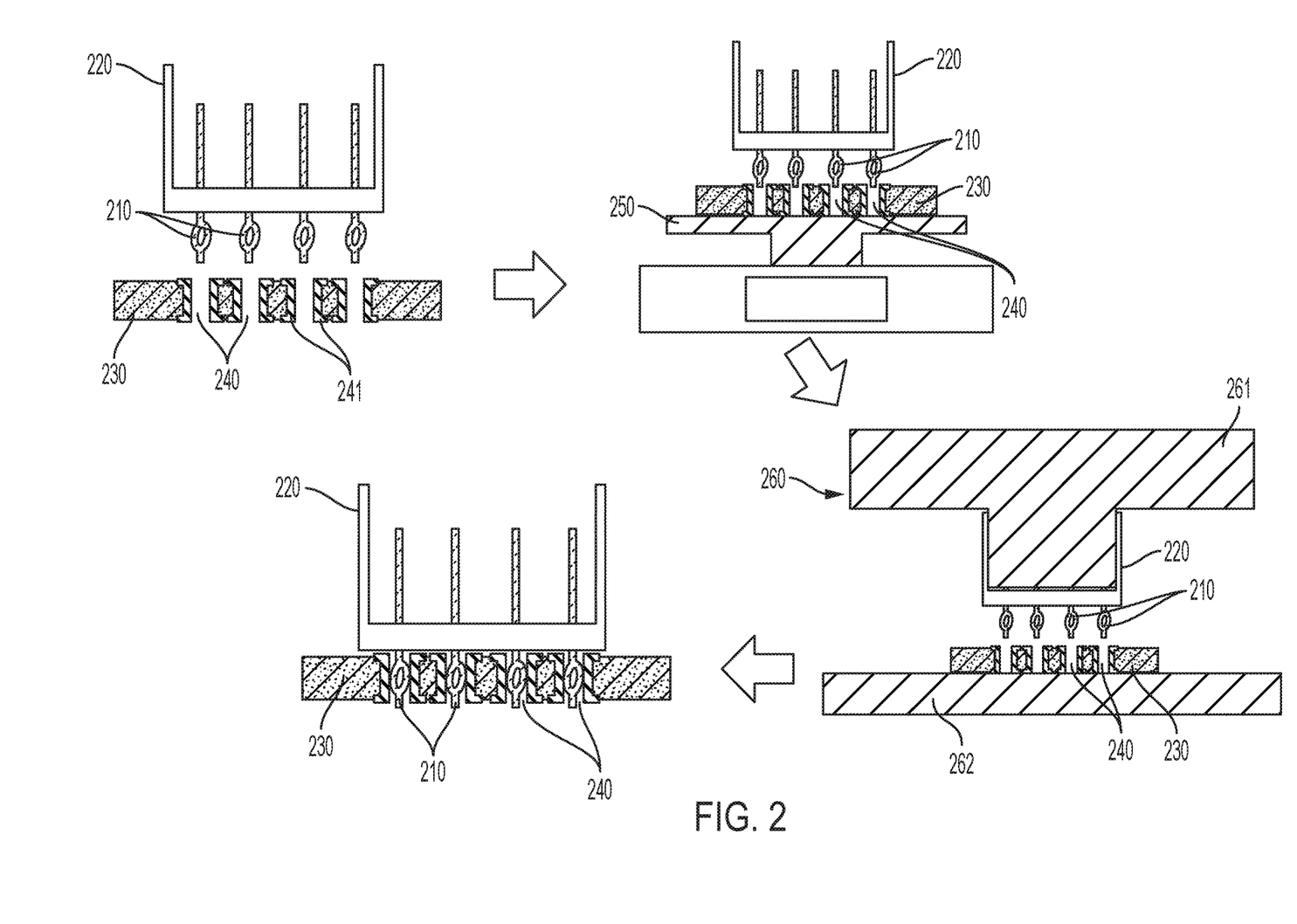
FIG. 2 is a flow diagram schematically illustrating the press-fit insertion method of FIG. 1 according to one or more embodiments of the present invention.
Figure 3:
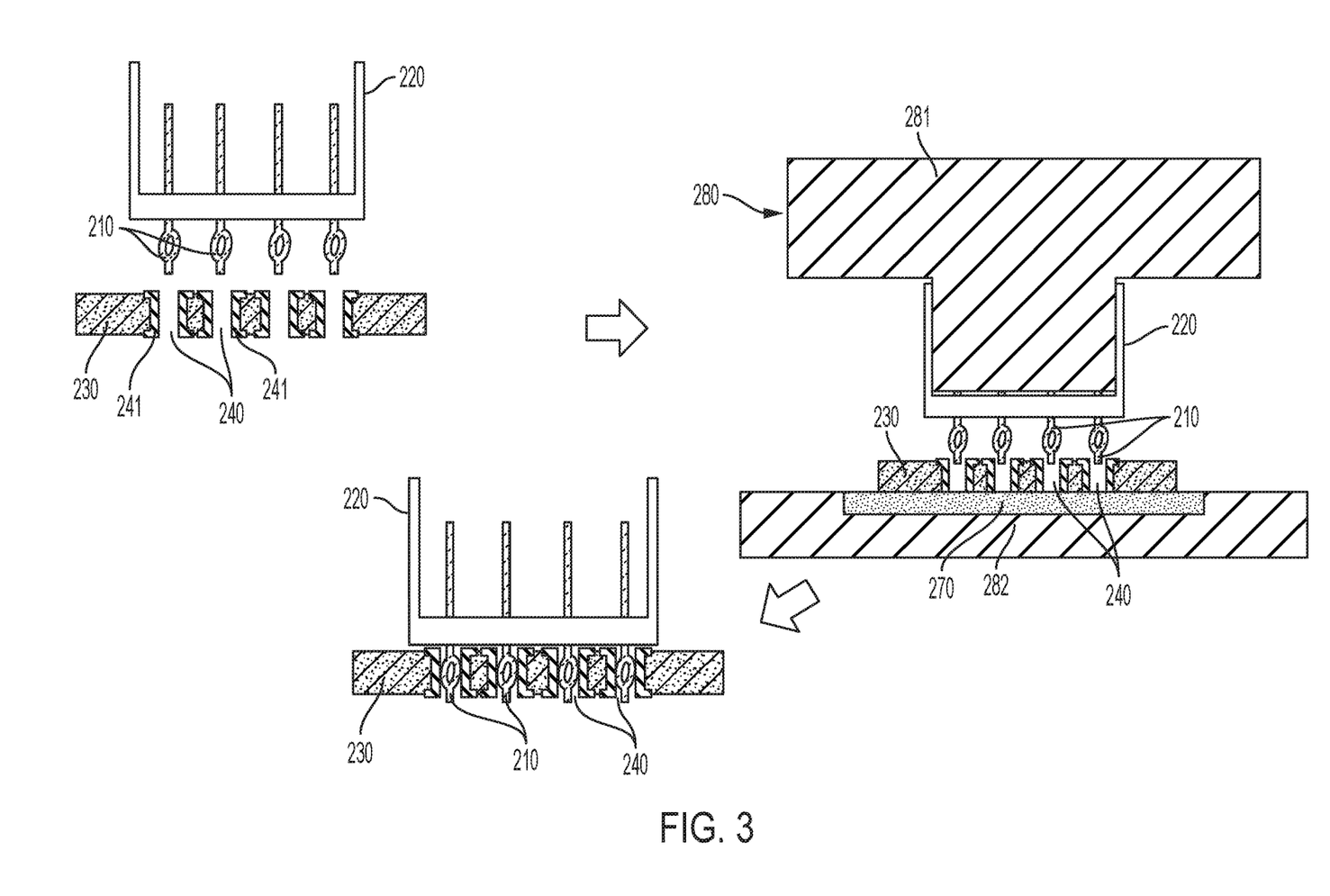
FIG. 3 is a flow diagram schematically illustrating the press-fit insertion method of FIG. 1 according to one or more embodiments of the present invention.

With reference to FIGS. 2 and 3, various operations of the method of FIG. 1 are schematically illustrated.

As shown in the first image of FIG. 2, the press-fit pins 210 are loaded into a connector 220 and the connector 220 is disposed proximate to a PCB 230. The PCB 230 is formed to define PTHs 240 with plating 241. The PCB 230 can include organic or inorganic dielectric material and the plating 241 can include electrically conductive material, such as copper or another suitable metal or metallic alloy. As is also shown in the first image of FIG. 2, an alignment or profile of the press-fit pins 210 relative to the PTHs 240 can be inspected and verified at this point in operation 104 so that it can be determined whether the press-fit pins 210 are generally positioned in an alignment condition with corresponding PTHs 240.

As shown in the second and third images of FIG. 2, the PCB 230 can be placed on a heating apparatus 250 for conducting the heating of operation 102 and the pressing of operation 103 can be executed within a press 260. The heating apparatus 250 can include or be provided as a hot plate or another suitable feature (e.g., a coil, a hot air blower, etc.) and is separate from the press 260. The press 260 can include a press head 261, which impinges against the connector 220, and a backing plate 262, which provides support for the PCB 230. In these or other cases, the heating of operation 102 can include heating the PCB 230 using the heating apparatus 250 and transferring the PCB 230 from the heating apparatus 250 to the press 260 while maintaining the PCB 230 in a state of having an elevated temperature.

As shown in the fourth image of FIG. 2, following the pressing of operation 103, the press-fit pins 210, the connector 220 and the PCB 230 can be removed from the press 260. At this point, operation 105 can be executed whereby it is verified that the connector 210 is fully seated on the PCB 230 and that no damage is evident following the pressing.

The first and third images of FIG. 3 are similar to the first and fourth images of FIG. 2 and need not be described further.

As shown in the second image of FIG. 3, the PCB 230 can be placed on a heating apparatus 270 for conducting the heating of operation 102 and the pressing of operation 103 can be executed within a press 280. In this case, the heating apparatus 270 can include or be provided as a hot plate or another suitable feature (e.g., a coil, a hot air blower, etc.) that is incorporated within the press 280. As above, the press 280 can include a press head 281, which impinges against the connector 220, and a backing plate 282, which provides support for the PCB 230. The heating apparatus 270 can be integrated within the backing plate 282. In these or other cases, the heating of operation 102 can include heating the PCB 230 using the heating apparatus 270 within the press 280.

Figure 4:
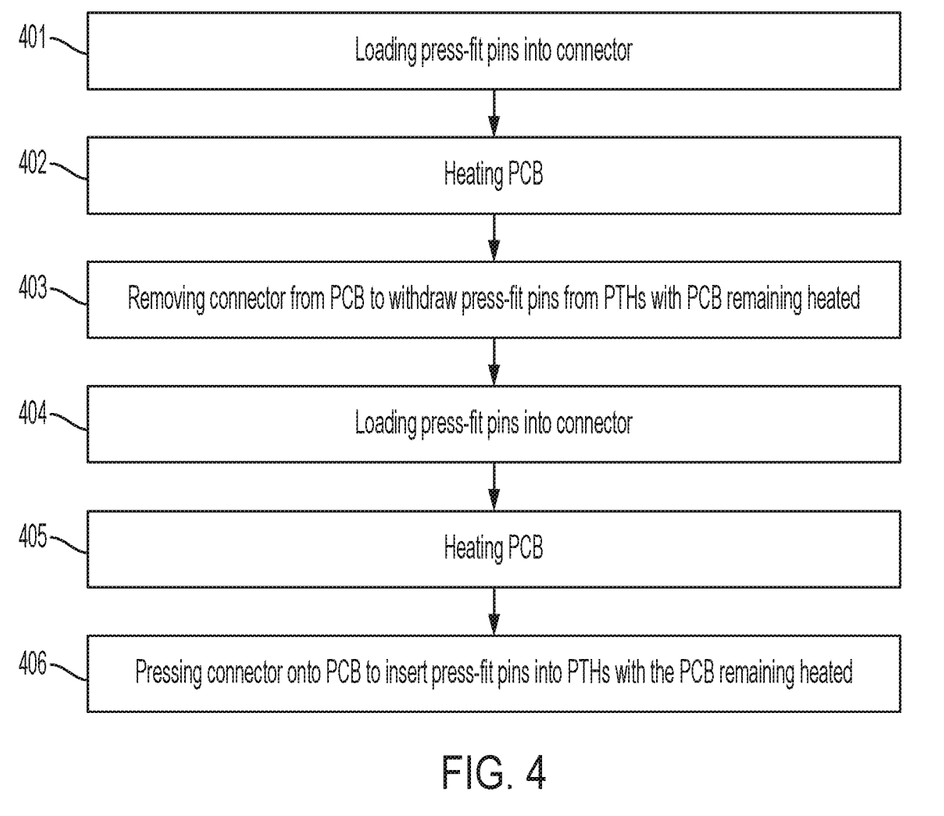
FIG. 4 is a flow diagram illustrating a press-fit rework method according to one or more embodiments of the present invention.

With reference to FIG. 4, a press-fit rework method is provided for cases in which previously inserted press-fit pins need to be removed from PTHs of a PCB. As shown in FIG. 4, the method includes loading press-fit pins, which are already inserted into PTHs of PCB into a connector (401), heating the PCB (402) and removing the connector from the PCB to withdraw the press-fit pins from the PTHs with the PCB remaining heated (403).

It is normally expected that a final diameter of each press-fit pin will be greater than a diameter of the corresponding PTH and that the removing will allow each press-fit pin to assume its initial diameter once it is withdrawn from the corresponding PTH. However, in those cases where the initial diameter of each press-fit pin is greater than the diameter of the corresponding PTH by an amount which is outside of normal parameters, the removal could result in press-fit pin damage or PTH damage but for the heating of operation 402. The heating of operation 402 effectively causes the PTH for each press-fit pin to enlarge due to thermal expansion which allows the corresponding press-fit pin to be removed at reduced press-fit forces and without risk of stress or strain that might otherwise lead to the damage. The thermal expansion provided by the heating also negates any need for lubrication of the PTHs which could otherwise lead to yield, contamination or reliability problems.

The heating of the PCB of operation 402 can include heating the PCB to above an elevated temperature at which the removal of the press-fit pins into the PTHs is eased due to thermal expansion and the removing of operation 403 can be executed with the PCB remaining heated above the elevated temperature.

While the heating of operation 402 is generally directed toward the PCB, it is to be understood that some heating effects can be exhibited at the press-fit pins or the connector. In these or other cases, it is to be understood that the degree of the heating and the heating effects of the PCB will be greater than the degree of the heating and the heating effects of the press-fit pins or the connector. That is, to whatever extent the press-fit pins or the connector experiences thermal expansion due to heating effects, thermal expansion of the PCB will be more significant. Thus, even thermally expanded press-fit pins will still be removable or withdrawable from thermally expanded PTHs.

In accordance with one or more further embodiments of the present invention and as shown in FIG. 4, the method can further include a press-fit insertion method similar to the method of FIG. 1 which includes loading press-fit pins into the connector (404), heating the PCB (405) and pressing the connector onto the PCB to insert the press-fit pins into the PTHs with the PCB remaining heated (406).

As explained above with reference to FIGS. 2 and 3, the removing of operation 403 can be executed in a rework tool. In these or other cases, the heating of operation 402 can include heating the PCB using a heating apparatus separate from the rework tool and transferring the PCB from the heating apparatus to the rework tool or heating the PCB using a heating element incorporated within the rework tool.

Figure 5:
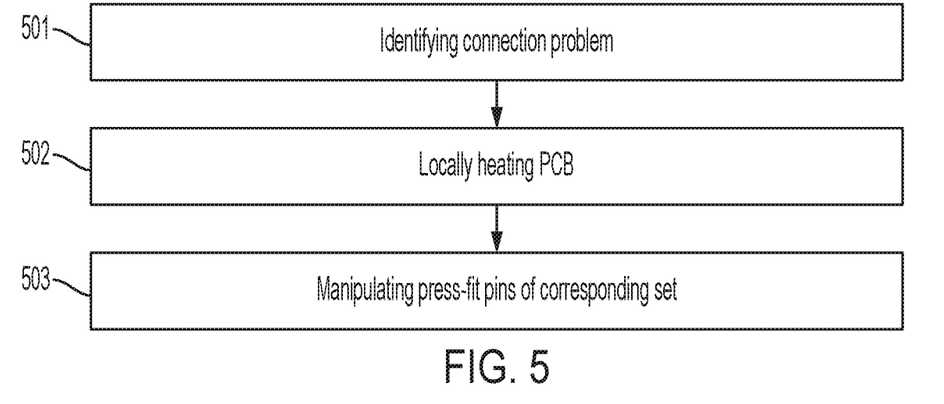
FIG. 5 is a flow diagram illustrating a method of localized press-fit insertion and rework according to one or more embodiments of the present invention.
Figure 6:
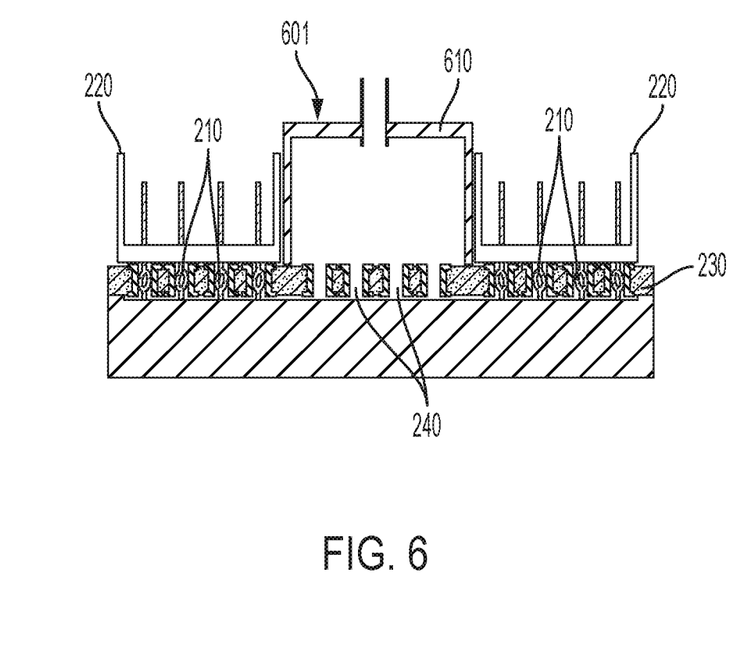
FIG. 6 is a side view of an operation of a localized press-fit insertion or rework method according to one or more embodiments of the present invention.
Figure 7:
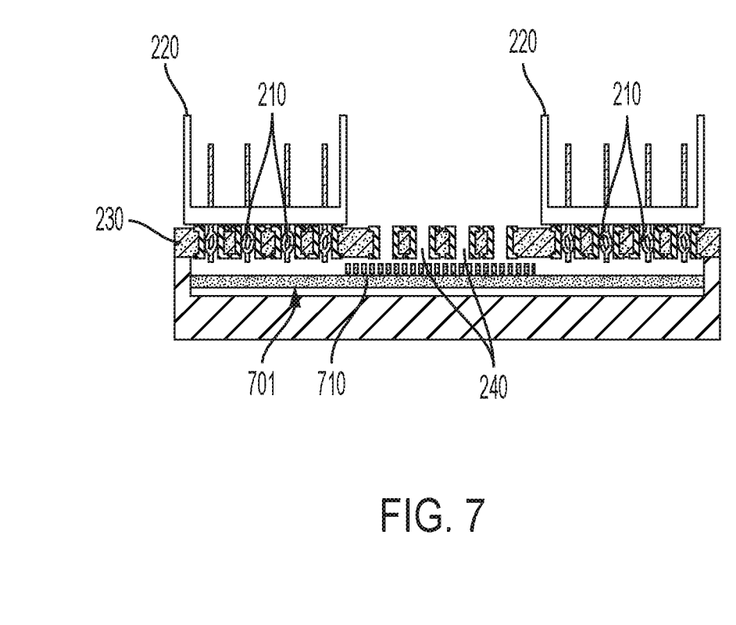
FIG. 7 is a side view of an operation of a localized press-fit insertion or rework method according to one or more embodiments of the present invention.

With reference to FIGS. 5-7, the methods of FIGS. 1 and 4 can each be generalized as a method of localized press-fit insertion and rework for use with a PCB defining sets of plated through holes PTHs into or from which corresponding sets of press-fit pins are insertable or withdrawable. As shown in FIG. 5, these methods of localized press-fit insertion and rework include identifying a connection problem with a set of the PTHs and a corresponding set of the press-fit pins (501), locally heating a portion of the PCB at a location of the set of the PTHs (502) and manipulating (i.e., inserting or withdrawing) the press-fit pins of the corresponding set of the press-fit pins relative to the PTHs with the portion of the PCB remaining locally heated (503).

As shown in FIG. 6, the manipulating of operation 503 can be executed in an external tool and the local heating of operation 502 can include locally heating the portion of the PCB using a local heating apparatus 601 separate from the external tool and transferring the PCB from the local heating apparatus 601 to the external tool. Here, the local heating apparatus 601 can include or be provided as a heating nozzle 610 that surrounds and blows hot air onto only the set of the problematic PTHs.

As shown in FIG. 7, the manipulating of operation 503 can be executed in an external tool and the local heating of operation 502 can include locally heating the portion of the PCB using a local heating element 701 which is incorporated within the external tool. Here, the local heating element 701 can include or be provided as a locally activatable heating element 710.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A press-fit rework method, comprising:
   loading press-fit pins, which are inserted into plated through holes (PTHs) of a printed circuit board (PCB), into a connector;
   heating the PCB; and
   removing the connector from the PCB to withdraw the press-fit pins from the PTHs with the PCB remaining heated,
   wherein:
   the heating comprises heating the PCB and heating one or more of the press-fit pins and the connector, and
   the heating of the PCB is to a greater degree than the heating of the one or more of the press-fit pins and the connector.

2. The press-fit rework method according to claim 1, wherein a final diameter of each press-fit pin is greater than a diameter of the corresponding PTH.

3. The press-fit rework method according to claim 1, wherein:
   the heating of the PCB comprises heating the PCB to above an elevated temperature,
   the removing is executed with the PCB remaining heated above the elevated temperature.

4. The press-fit rework method according to claim 1, further comprising a press-fit insertion method, comprising:
   loading press-fit pins into the connector;
   heating the PCB; and
   pressing the connector onto the PCB to insert the press-fit pins into the PTHs with the PCB remaining heated.

* * * * *